(12) United States Patent
Tao et al.

(10) Patent No.: US 11,545,404 B2
(45) Date of Patent: Jan. 3, 2023

(54) III-V COMPOUND SEMICONDUCTOR DIES WITH STRESS-TREATED INACTIVE SURFACES TO AVOID PACKAGING-INDUCED FRACTURES, AND RELATED METHODS

(71) Applicant: QUALCOMM Incorporated, San Diego, CA (US)

(72) Inventors: Gengming Tao, San Diego, CA (US); Bin Yang, San Diego, CA (US); Xia Li, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/868,147

(22) Filed: May 6, 2020

(65) Prior Publication Data

US 2021/0351095 A1 Nov. 11, 2021

(51) Int. Cl.
*H01L 23/31* (2006.01)
*H01L 21/56* (2006.01)
(Continued)

(52) U.S. Cl.
CPC .......... *H01L 23/3114* (2013.01); *H01L 21/56* (2013.01); *H01L 21/78* (2013.01);
(Continued)

(58) Field of Classification Search
CPC ..... H01L 23/3114; H01L 21/56; H01L 24/13; H01L 24/81; H01L 24/94; H01L 24/85; H01L 24/45; H01L 21/78
See application file for complete search history.

(56) References Cited

U.S. PATENT DOCUMENTS

| 8,759,865 | B2 * | 6/2014 | Tsai | ........................ H01L 33/62 |
| | | | | 257/98 |
| 9,978,644 | B1 | 5/2018 | Rinne | |
| 10,006,822 | B2 * | 6/2018 | Chen | ..................... G01L 19/143 |
| 10,090,812 | B2 * | 10/2018 | Modi | ...................... H01L 23/66 |

(Continued)

OTHER PUBLICATIONS

Raj, G. et al., "Polarization and Breakdown Analysis of AlGaN Channel HEMTs with AlN Buffer," World Journal of Condensed Matter Physics, vol. 5, 2015, Scientific Research Publishing, pp. 232-243.

(Continued)

*Primary Examiner* — Nicholas J Tobergte
(74) *Attorney, Agent, or Firm* — W&T

(57) ABSTRACT

Before a semiconductor die of a brittle III-V compound semiconductor is encapsulated with a molding compound during package fabrication, side surfaces of the semiconductor die are treated to avoid or prevent surface imperfections from propagating and fracturing the crystal structure of the substrate of the III-V compound semiconductor under the stresses applied as the molding compound solidifies. Surfaces are treated to form a passivation layer, which may be a passivated layer of the substrate or a passivation material on the substrate. In a passivated layer, imperfections of an external layer are transformed to be less susceptible to fracture. Passivation material, such as a polycrystalline layer on the substrate surface, diffuses stresses that are applied by the molding compound. Semiconductor dies in flip-chip and wire-bond chip packages with treated side surfaces as disclosed have a reduced incidence of failure caused by die fracturing.

13 Claims, 12 Drawing Sheets

(51) Int. Cl.
  *H01L 21/78* (2006.01)
  *H01L 23/00* (2006.01)
(52) U.S. Cl.
  CPC .............. *H01L 24/13* (2013.01); *H01L 24/45* (2013.01); *H01L 24/81* (2013.01); *H01L 24/85* (2013.01); *H01L 24/94* (2013.01)

(56) References Cited

U.S. PATENT DOCUMENTS

| | | | |
|---|---|---|---|
| 2003/0137062 A1* | 7/2003 | Akram | H01L 23/3135 257/788 |
| 2008/0290511 A1* | 11/2008 | Van Veen | H01L 25/0657 257/737 |
| 2010/0213485 A1* | 8/2010 | McKenzie | H01L 33/20 257/E33.013 |
| 2016/0254188 A1 | 9/2016 | Priewasser | |
| 2017/0011982 A1* | 1/2017 | Theuss | H01L 24/97 |
| 2017/0263526 A1 | 9/2017 | Mizuno et al. | |
| 2017/0287782 A1* | 10/2017 | Dang | H01L 24/97 |
| 2020/0219815 A1* | 7/2020 | Elsherbini | H01L 23/5386 |
| 2021/0111147 A1* | 4/2021 | Lift | H01L 23/42 |

OTHER PUBLICATIONS

Watanabe, K. et al., "Quantitative In-depth Profile of Passivated Oxide Layers of GaAs by AES-SIMS—a Comparison of Thermal, Anodic and Plasma Oxidations," Proceedings of the 9th Conference on Solid State Devices, Tokyo, 1977; Japanese Journal of Applied Physics, vol. 17, Supplement 17-1, 1978, pp. 335-340.

Yamasaki, K. et al., "Anodic Oxidation of GaAs Using Oxygen Plasma," Proceedings of the 9th Conference on Solid State Devices, Tokyo, 1977; Japanese Journal of Applied Physics, vol. 17, Supplement 17-1, 1978, pp. 321-336.

Burte, E.P., et al., "The Correlation Between the Breakdown Voltage of Power Devices Passivated by Semi-Insulating Polycrystalline Silicon and The Effective Density of Interface Charges", IEEE Transactions on Electron Devices, IEEE Service Center, Pisacataway, NJ, vol. 38, No. 6, Jun. 1, 1991 (Jun. 1, 1991), XP000205849, pp. 1505-1509, ISSN: 0018-9383, DOI: 10.1109/16.81646 the whole document.

International Search Report and Written Opinion for International Patent Application No. PCT/US2021/029200, dated Aug. 9, 2021, 18 pages.

Wang, C-C., et al., "Fabrication of GaAs Schottky Diode by Liquid Phase Chemical Enhanced Oxidation", Solid State Electronics, Elsevier Science Publishers, Barking, GB, vol. 48, No. 9, Sep. 1, 2004 (Sep. 1, 2004), XP004518824, pp. 1683-1686, ISSN: 0038-1101, DOI:10.1016/J.SSE.2004.03.003 2. Experimental.

Wilmsen, C.W., "Oxide/III-V Compound Semiconductor Interfaces", Jan. 1, 1985 (Jan. 1, 1985), Physics and Chemistry of III-V Compound Semiconductor Interfaces, Kluwer Academic Publishers, US, XP008098095, pp. 403-462, ISBN: 978-0-306-41769-6, 5. Plasma-Grown Oxide, pp. 453-456, figure 28.

\* cited by examiner

III-V COMPOUND SEMICONDUCTOR DIES WITH STRESS-TREATED INACTIVE SURFACES TO AVOID PACKAGING-INDUCED FRACTURES, AND RELATED METHODS

BACKGROUND

I. Field of the Disclosure

The field of the disclosure relates to electronic circuits fabricated in semiconductor dies and, more particularly, to packaging of semiconductor dies in a chip package.

II. Background

Silicon has been the preferred semiconductor material in semiconductor dies for electronic devices because it provides high performance at low cost. III-V compound semiconductors are another type of semiconducting material that can overcome certain performance limitations of silicon and are very useful in, for example, optoelectronic devices and transistors for power amplifier circuits. III-V compounds are alloys that include elements from Group III and Group V of the periodic table. III-V compounds have become even more attractive with the increasing performance needs of electronic devices, such as mobile phones implementing 5G technology, but III-V compounds do have some disadvantages. For example, silicon wafers are much less expensive to manufacture than wafers of III-V compounds. In addition, compounds are more brittle than silicon, which has made it difficult to fabricate wafers of III-V compounds that are as large as silicon wafers. As a result, wafers of III-V compounds are smaller in diameter than silicon, which reduces the number of individual dies that can be made from each wafer, further increasing cost.

In addition, the brittleness of individual dies made of III-V compounds becomes a problem during the manufacture of a semiconductor chip package. To fabricate a semiconductor chip package, a semiconductor die is mounted on a substrate or laminate. The semiconductor die is encapsulated by a molding compound formed around the die to protect the semiconductor die and its electrical connections to the substrate from, for example, handling and environmental factors. A problem arises when micro-cracks, or very small surface imperfections, are formed in the surface of the crystal lattice of the III-V compound material from which the die is made. In the step of dicing a wafer into individual dies, a saw blade cuts the die, which stresses the remaining cut surfaces. Although such stresses may not cause the III-V compound material to reach its breakpoint, micro-cracks and other imperfections form due to the strain. With micro-cracking, a material's strength, stiffness, and stability decrease, possibly leading to undesirable properties. When the molding compound is formed around the die, encapsulation stresses are induced on the micro-cracks in the surface of the die. Encapsulation stress on these imperfections can cause the material to reach its breakpoint, propagating the micro-crack, fracturing the die, and rendering the semiconductor chip package inoperable.

SUMMARY OF THE DISCLOSURE

Aspects disclosed herein include III-V compound semiconductor dies with stress-treated inactive surfaces to avoid packaging-induced fractures. Related methods are also disclosed. In examples disclosed herein, a III-V compound semiconductor die having a brittle crystalline structure includes an active region, including at least one functional circuit and an active surface, and an inactive region comprising a substrate comprising a back surface opposite to the active surface and a plurality of side surfaces. The plurality of side surfaces of the substrate are created with imperfections or micro-cracks during processes for shaping (e.g., dicing and/or thinning) the III-V compound semiconductor die from a wafer. Micro-cracks can make the brittle crystalline structure of the III-V compound semiconductor die vulnerable to fracture under packaging-induced stresses. The compound semiconductor die is included in a semiconductor chip package that also includes a molding compound. In one exemplary aspect herein, a semiconductor chip package includes a passivation layer on the plurality of side surfaces of the substrate to avoid fracture of the III-V compound semiconductor die. The semiconductor chip package includes the molding compound disposed on the passivation layer. The passivation layer avoids or prevents micro-cracks from propagating through the crystal structure of the III-V compound semiconductor die under the influence of the molding compound. In one exemplary aspect, the passivation layer is a passivated layer of the substrate of the III-V compound semiconductor die. In another exemplary aspect, the passivation layer is a passivation material on the substrate. In an exemplary embodiment, the passivated layer of the substrate is a native oxide of the III-V compound. In another exemplary aspect, the passivation material is a polycrystalline layer.

In another exemplary aspect, processes for forming the passivation layer on the plurality of side surfaces to avoid packaging-induced fractures are disclosed. The processes for forming the passivation layer do not subject the III-V compound semiconductor die to high temperatures (>400° C.) that may degrade functional circuits. For example, forming the passivation layer on the plurality of side surfaces of the substrate of the III-V compound semiconductor die includes treating the plurality of side surfaces to form the passivation layer. In one exemplary aspect, treating the plurality of side surfaces includes a treatment to form a passivated layer of the substrate on the plurality of side surfaces of the substrate. In one exemplary aspect, the treatment to form the passivated layer of the substrate includes an oxidation treatment forming a native oxide on the plurality of side surfaces by exposing the plurality of side surfaces to an oxygen plasma or using another oxidation method. The oxidation treatment removes the micro-cracks and transforms a surface layer of the substrate of the III-V compound semiconductor die into a thick native oxide that is less susceptible to fracture. In another exemplary aspect, treating the plurality of side surfaces includes depositing a passivation material, such as a polycrystalline layer, in and on the micro-cracks in the plurality of side surfaces to diffuse stresses induced by the molding compound. Treating the plurality of side surfaces of semiconductor dies to form passivation layers in flip-chip and wire-bond semiconductor chip packages as disclosed herein reduces incidence of failure caused by die fracturing.

In a first exemplary aspect, a semiconductor chip package is provided. The semiconductor chip package includes a III-V compound semiconductor die (III-V compound die), a passivation layer, and a molding compound. The III-V compound die includes an active region including at least one functional circuit and an active surface. The III-V compound die also includes an inactive region including a substrate including a back surface opposite to the active surface, and a plurality of side surfaces. The passivation layer is disposed on the plurality of side surfaces of the substrate and the molding compound is disposed on the passivation layer.

In another exemplary aspect, a method of fabricating a semiconductor chip package is provided. The method includes bonding a semiconductor wafer including a III-V compound to a carrier, an inactive back surface of the semiconductor wafer facing the carrier, and forming a plurality of functional circuits in an active region of the semiconductor wafer, the active region including an active surface opposite to the inactive back surface of the semiconductor wafer. The method further includes forming a protective layer on the active surface and dicing the semiconductor wafer into at least one III-V compound die each including an active region and an inactive region comprising a substrate, wherein a functional circuit in the active region of one III-V compound die of the at least one III-V compound die includes one of the plurality of functional circuits in the active region of the semiconductor wafer, the dicing exposes a plurality of side surfaces of the substrate of the at least one III-V compound die, and an inactive back surface of the substrate of the at least one III-V compound die comprises a portion of the inactive back surface of the semiconductor wafer. The method further includes forming a passivation layer on the plurality of side surfaces of the substrate of the at least one III-V compound die, and removing the protective layer from the active surface.

In another exemplary aspect, a method of fabricating a semiconductor chip package is provided. The method includes forming a plurality of functional circuits in an active region of a semiconductor wafer including a III-V compound, with the active region including an active surface opposite to a back side of the semiconductor wafer, and forming a protective layer on the active surface. The method further includes bonding the protective layer to a first carrier and thinning the back side of the semiconductor wafer to form an inactive back surface. The method further includes forming a passivation layer on the inactive back surface of the semiconductor wafer, bonding a second carrier to the passivation layer, and removing the first carrier from the protective layer. The method further includes dicing the semiconductor wafer into at least one III-V compound die each comprising an active region and an inactive region comprising a substrate, wherein a functional circuit in the active region of one III-V compound die of the at least one III-V compound die includes one of the plurality of functional circuits in the active region of the semiconductor wafer, the dicing exposes a plurality of side surfaces of the substrate of the at least one III-V compound die, and an inactive back surface of the substrate of the at least one compound die comprises a portion of the inactive back surface of the semiconductor wafer. The method further includes forming the passivation layer on the plurality of side surfaces of the substrate of the at least one III-V compound die. The method further includes removing the protective layer from the active surface.

DETAILED DESCRIPTION

Figure 1:
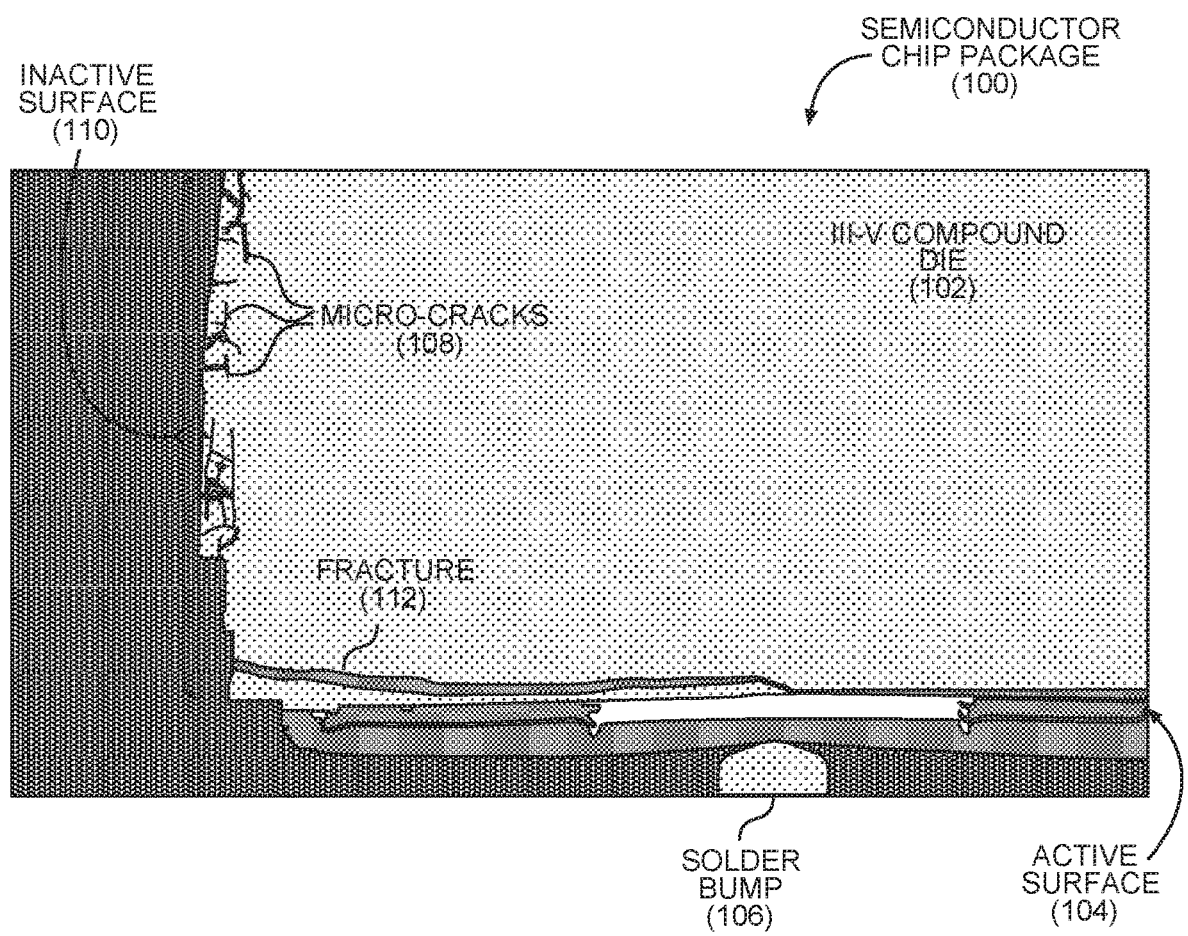
FIG. 1 is an illustration of a cross-sectional side view of a gallium arsenide (GaAs) die that is fractured by stresses applied to surface micro-cracks by a molding compound.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include compound semiconductor dies with stress-treated inactive surfaces to avoid packaging-induced fractures. Related methods are also disclosed. In examples disclosed herein, a III-V compound semiconductor die having a brittle crystalline structure includes an active region, including at least one functional circuit and an active surface, and an inactive region comprising a substrate comprising a back surface opposite to the active surface and a plurality of side surfaces. The plurality of side surfaces of the substrate are created with imperfections or micro-cracks during processes for shaping (e.g., dicing and/or thinning) the compound semiconductor die from a wafer. Micro-cracks can make the brittle crystalline structure of the III-V compound semiconductor die vulnerable to fracture under packaging-induced stresses. The compound semiconductor die is included in a semiconductor chip package that also includes a molding compound. In one exemplary aspect herein, a semiconductor chip package includes a passivation layer on the plurality of side surfaces of the substrate to avoid fracture of the III-V compound semiconductor die. The semiconductor chip package includes the molding compound disposed on the passivation layer. The passivation layer avoids or prevents micro-cracks from propagating through the crystal structure of the III-V compound semiconductor die under the influence of the molding compound. In one exemplary aspect, the passivation layer is a passivated layer of the substrate of the compound semiconductor die. In another exemplary aspect, the passivation layer is a passivation material on the substrate. In an exemplary embodiment, the passivated layer of the substrate is a native oxide of the III-V compound. In another exemplary aspect, the passivation material is a polycrystalline layer.

In another exemplary aspect, processes for forming the passivation layer on the plurality of side surfaces to avoid packaging-induced fractures are disclosed. The processes for forming the passivation layer do not subject the III-V compound semiconductor die to high temperatures (>400° C.) that may degrade functional circuits. For example, forming the passivation layer on the plurality of side surfaces of the substrate of the III-V compound semiconductor die includes treating the plurality of side surfaces to form the passivation layer. In one exemplary aspect, treating the plurality of side surfaces includes a treatment to form a passivated layer of the substrate on the plurality of side surfaces of the substrate. In one exemplary aspect, the treatment to form the passivated layer of the substrate includes an oxidation treatment forming a native oxide on the plurality of side surfaces by exposing the plurality of side surfaces to an oxygen plasma or using another oxidation method. The oxidation treatment removes the micro-cracks and transforms a surface layer of the substrate of the III-V compound semiconductor die into a thick native oxide that is less susceptible to fracture. In another exemplary aspect, treating the plurality of side surfaces includes depositing a passivation material, such as a polycrystalline layer, in and on the micro-cracks in the plurality of side surfaces to diffuse stresses induced by the molding compound. Treating the plurality of side surfaces of semiconductor dies to form passivation layers in flip-chip and wire-bond semiconductor chip packages as disclosed herein reduces incidence of failure caused by die fracturing.

FIG. 1 is a magnified cross-sectional side view of a portion of a semiconductor chip package 100 that illustrates encapsulation stresses induced in micro-cracks on the surface of a semiconductor die. In this regard, the semiconductor chip package 100 includes a III-V compound (e.g., gallium-arsenide (GaAs)) die 102 with an active surface 104. The III-V compound die 102 is coupled in a flip-chip configuration to a substrate or laminate (not shown) by a solder bump 106. Micro-cracks 108 are present along an inactive surface 110 of the III-V compound die 102. As a result of encapsulation stress, a fracture 112 propagates from one of the micro-cracks 108 through the crystal lattice of the compound die 102, causing the semiconductor chip package 100 to fail to operate. Each failure of a semiconductor chip package 100 reduces yield and increases manufacturing costs.

Figure 2:
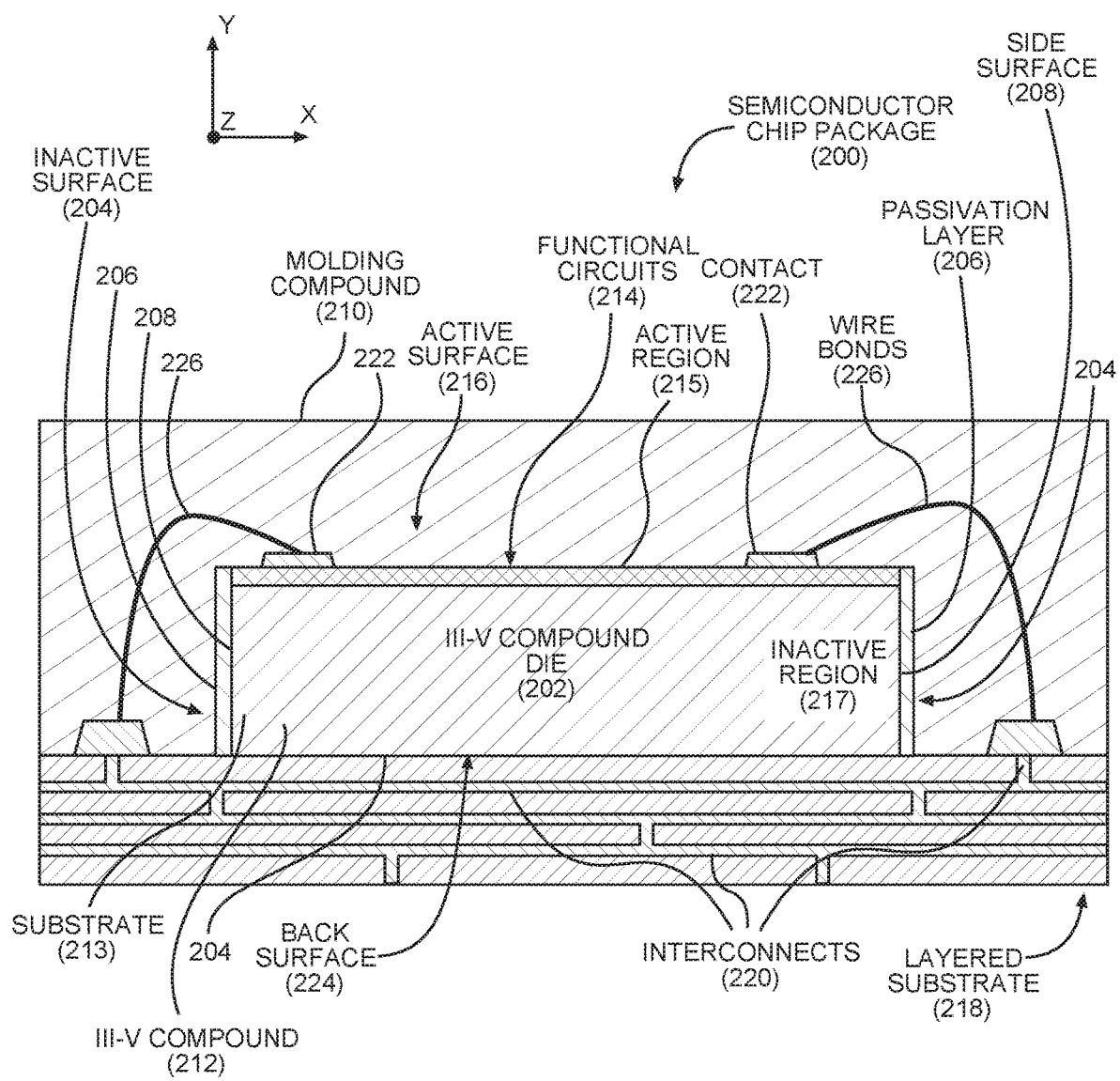
FIG. 2 is a cross-sectional side view of an exemplary wire-bonded semiconductor chip package including a passivation layer on inactive side surfaces of a III-V compound semiconductor die to avoid fracture by diffusing stress exerted on surface micro-cracks by a molding compound.

FIG. 2 is a cross-sectional side view of a wire-bonded semiconductor chip package 200 ("chip package 200") including a III-V compound semiconductor die 202 ("III-V compound die 202") that includes a plurality of inactive surfaces 204 treated with a passivation layer 206. In FIG. 2, the plurality of inactive surfaces 204 is a plurality of side surfaces 208 of the III-V compound die 202. The passivation layer 206 is provided to avoid fracture of the III-V compound die 202 by reducing encapsulation stresses exerted on the plurality of inactive surfaces 204 by a molding compound 210 in contact with the passivation layer 206 on each of the plurality of inactive surfaces 204. The molding compound 210 is employed to encapsulate the III-V compound die 202 in a structure of the chip package 200 and to isolate the III-V compound die 202 from its environment. The molding compound 210 may be in direct contact, meaning without anything intervening, or in indirect contact, meaning at least one intervening layer is between the molding compound 210 and the passivation layer 206. In either case, the molding compound 210 exerts stress (i.e., force), referred to herein as encapsulation stress, on the passivation layer 206. The encapsulation stress can arise from, for example, a difference in the rates of expansion or contraction of the III-V compound die 202 and the molding compound 210 in response to a change in temperature of the chip package 200. Encapsulation stress may be a force parallel to or orthogonal to the inactive surfaces 204.

The III-V compound die 202 is formed from a wafer of a III-V compound 212, which is any alloy of elements from Group III and Group V of the periodic table of elements, such as Gallium Arsenide (GaAs), for example. The III-V compound 212 may be an alloy of two or more elements. Transistors formed in III-V compound dies are capable of higher performance than transistors formed in silicon, but alloys of compounds are crystalline structures that are more brittle than silicon. The III-V compound die 202 includes a substrate 213 that is separated from the rest of the III-V compound wafer in a dicing process and further shaped (e.g., thinned) in additional processes. Dicing may be achieved by various methods including fully or partially cutting the wafer with a saw blade or a laser. The dicing process induces subsurface damage and micro-cracks on the substrate 213, which can be particularly detrimental for packaging technologies that put a strain on the die. Imperfections, such as micro-cracks, formed along the side surfaces 208 of the substrate 213 of the compound die 202 due to the dicing process often provide potential sites for serious reliability problems, such as fracturing of the III-V compound die 202. This is particularly true of III-V compound semiconductors, because of their brittleness.

The molding compounds employed in the chip package 200 to encapsulate the III-V compound die 202, such as the molding compound 210, are generally composite materials such as epoxy mold compounds (EMCs) consisting of epoxy resins, curing agents, accelerators, fillers, flame retardants, adhesion promoters, phenolic hardeners, silicas, catalysts, pigments, and mold release agents. The molding compound 210 may initially be in a viscous state, but solidifies to provide a structural exterior of the chip package 200, and to protect the underlying III-V compound die 202. The solidified molding compound 210 may have a different coefficient of thermal expansion than the III-V compound die 202, which creates stresses at an intersection of the III-V compound die 202 and the molding compound 210 as a temperature of the chip package 200 changes. Having such stress exerted directly on a micro-crack could cause the micro-crack to propagate through the crystalline structure, causing the compound die 202 to fracture, but the passivation layer 206 formed on the inactive surfaces 204 avoids fracture of the III-V compound die 202 in one of two exemplary aspects.

In one exemplary aspect, the passivation layer 206 on side surfaces 208 of the III-V compound die 202 in FIG. 2 is a passivated layer of the substrate 213. In one embodiment, the passivated layer is a native oxide of the compound 212. To form the passivated layer, the side surfaces 208 are treated by oxidizing the III-V compound 212 by exposing the side surfaces 208 to an oxygen plasma. Oxidation in this manner causes bonds of the crystalline structure of the compound 212 to be broken and the atoms to be rearranged as the oxygen molecules are absorbed into the surface. The surface layer of the III-V compound 212 is transformed into a thick native oxide, removing the micro-cracks from the crystalline structure. In the example of a GaAs semiconductor, the native oxide is an arsenic oxide (e.g., $As_2O_3$) or gallium oxide ($Ga_2O_3$). By exposing the side surfaces 208 to the oxygen plasma for an oxidation time, a thick passivated layer (i.e., native oxide) is formed. The oxidation time depends on the setup, e.g., bias, frequency, and power employed in the application of the oxygen plasma, and may be in the range of minutes. The native oxide as the passivation layer 206 formed by this method is thicker than a naturally-occurring oxide formed in the presence of atmospheric oxygen. For example, a naturally-occurring oxide may be in the range of up to about 30 angstroms, whereas a native oxide formed by exposure to an oxygen plasma may be at least 1 micron (μm) and up to 2 μm in thickness, or thicker. As an alternative method, a wet chemical process can be employed to treat the side surfaces 208 to form a native oxide.

Another exemplary option for treating the side surfaces 208 to form the passivation layer 206 is to deposit a passivation material. In one embodiment, depositing the passivation material includes depositing a polycrystalline layer. In one example, the polycrystalline layer has a thickness of at least 0.1 μm. Rather than removing the micro-cracks and transforming the crystalline structure of the compound 212, the passivation layer 206 including the polycrystalline layer fills and/or covers the micro-cracks and other imperfections. The polycrystalline layer spreads or diffuses external forces that, if applied directly to a micro-crack, could cause the micro-crack to propagate and fracture the III-V compound die 202. Thus, the polycrystalline layer redirects these forces and avoids a fracture in the crystalline structure of the compound 212. Silicon nitride (SiN) and silicon oxide (SiO) are examples of polycrystalline materials that can be deposited by tools such as plasma chemical vapor deposition (PCVD), for example, to form the passivation layer 206. Other polycrystalline materials could also be deposited as a passivation layer.

In the chip package 200, the III-V compound die 202 includes functional circuits 214 in an active region 215 including an active surface 216. The active region 215 is adjacent to an inactive region 217 of the III-V compound die 202. The inactive region 217 includes the substrate 213. Functional circuits as disclosed herein are electrical and/or electronic circuits. The III-V compound die 202 is disposed on a layered substrate 218 that includes interconnects 220 to an external circuit (not shown). The active surface 216 of the III-V compound die 202 includes contacts 222 to the functional circuits 214, and a back surface 224 of the III-V compound die 202 is bonded to the layered substrate 218. The back surface 224 may be referred to herein as inactive because there are no functional circuits 214 on the back surface 224. The chip package 200 also includes wire bonds 226 for electrically coupling the contacts 222 on the active surface 216 to the interconnects 220 on the layered substrate 218.

Figure 3:
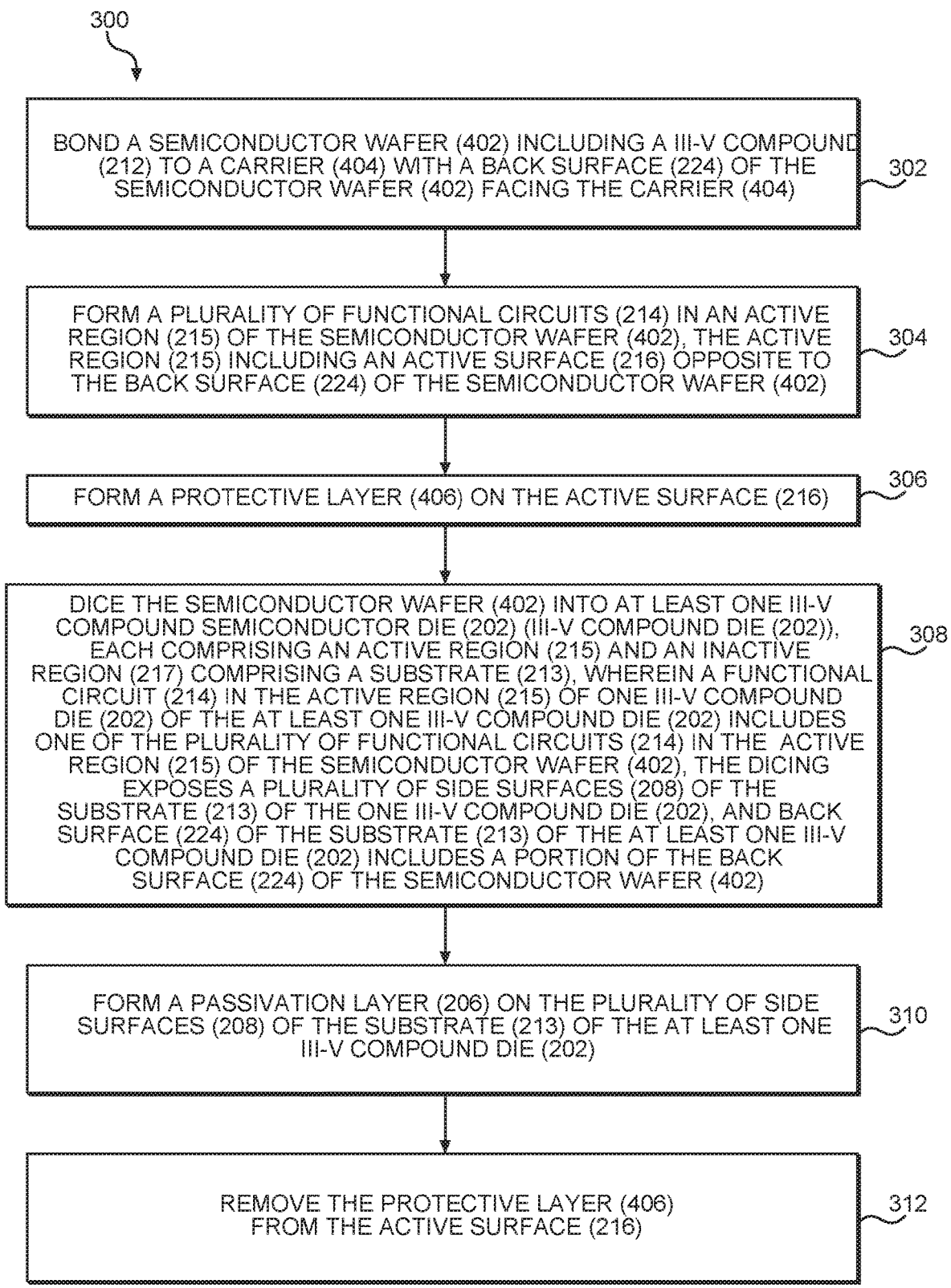
FIG. 3 is a flowchart of an exemplary method of fabricating a III-V compound semiconductor die to be employed in the wire-bonded semiconductor chip package in FIG. 2, wherein the method includes treating inactive surfaces of the III-V compound semiconductor die with a passivation layer to diffuse stress exerted by a molding compound.

FIG. 3 is a flowchart illustrating a method 300 of fabricating the III-V compound die 202 employed in the chip package 200 in FIG. 2. The method 300 is described below with reference to fabrication stages 400A-400D illustrated in FIGS. 4A-4D.

Figure 4A:
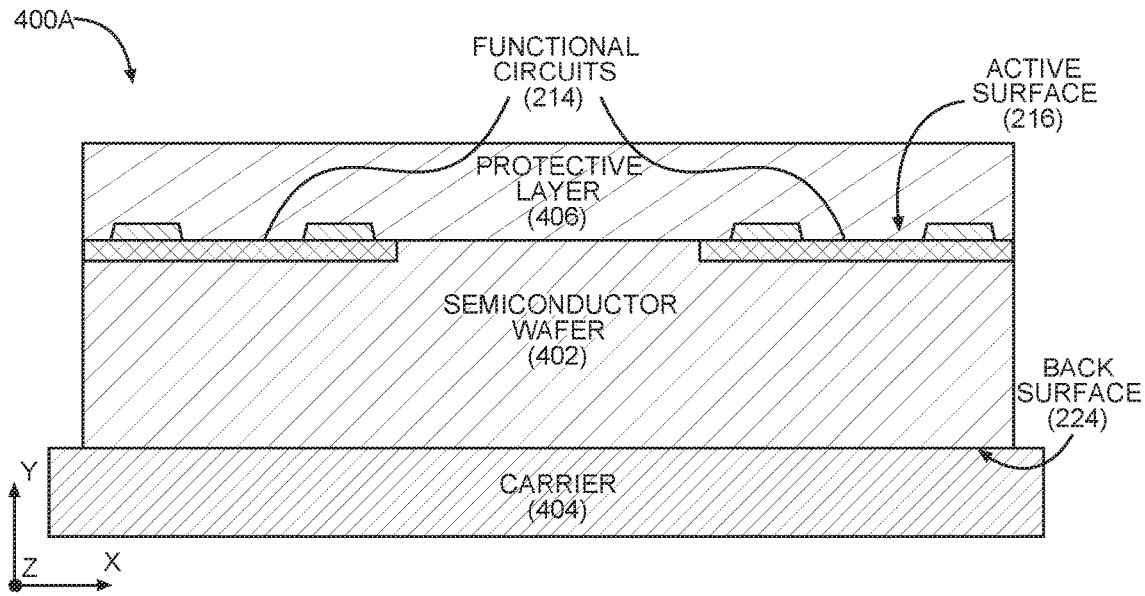
FIGS. 4A-4D are cross-sectional side views of exemplary fabrication stages during the fabrication of the III-V compound semiconductor die according to the exemplary method in FIG. 3.

FIG. 4A is a cross-sectional side view of fabrication stage 400A in which a semiconductor wafer 402 including the III-V compound 212 is bonded to a carrier 404 with the back surface 224 of the semiconductor wafer 402 facing the carrier 404 (block 302). The cross-sectional side views in FIGS. 4A-4I) are views in a direction of a Z-axis of a plane including an X-axis and a Y-axis. The carrier 404 prevents damage to the surface of the semiconductor wafer 402 (e.g., by scratching) and/or breakage of the semiconductor wafer 402 (e.g., by deformation) as the carrier 404 is employed to physically manipulate the semiconductor wafer 402 through processing steps. The method 300 includes forming a plurality of functional circuits 214 in the active region 215 of the semiconductor wafer 402 in portions that will become the III-V compound dies 202. The active region 215 includes an active surface (216) opposite to the back surface 224 of the semiconductor wafer 402 (block 304) which is coupled (e.g., bonded) to the carrier 404. The method 300 further includes forming a protective layer 406 on the active surface 216 (block 306). The protective layer 406 protects the functional circuits 214 during subsequent processing.

Figure 4B:
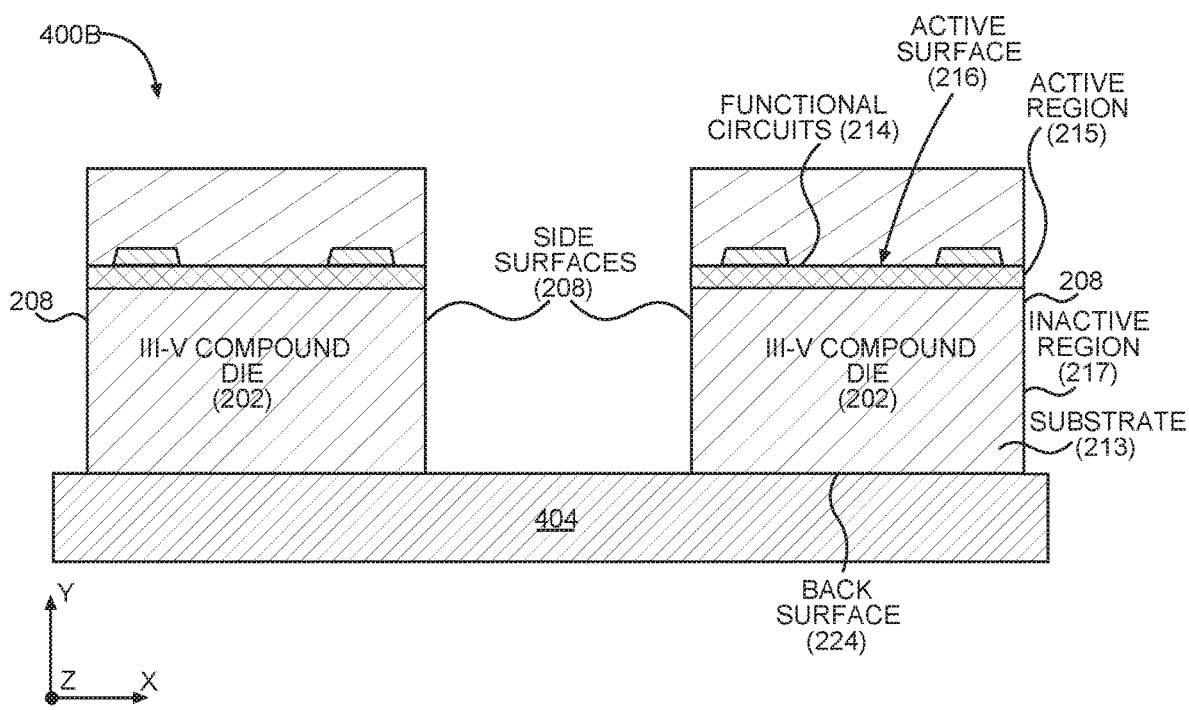

FIG. 4B is a cross-sectional side view of fabrication stage 400B which includes dicing the semiconductor wafer 402 into at least one III-V compound die 202, each of the at least one III-V compound die 202 including the active region 215 and the inactive region 217. The at least one III-V compound die 202 is diced from a portion of the semiconductor wafer 402 and may have a length dimension and a width dimension that are each in the range of about 1 millimeter (mm). A functional circuit 214 in the active region 215 of one III-V compound die 202 is one of the plurality of functional circuits 214 on the active region 215 of the semiconductor wafer 402. The dicing exposes the side surfaces 208 of the substrate 213 of the one III-V compound die 202. A back surface 224 of the substrate 213 of the one compound die 202 includes a portion of the semiconductor wafer 402 (block 308). The side surfaces 208 are exposed where portions of the semiconductor wafer 402, dicing streets in the active surface 216, are removed from between the portions of the semiconductor wafer 402 forming the at least one III-V compound die 202. As shown in FIG. 4B, the carrier 404 is not cut in fabrication stage 400B, and the at least one III-V compound die 202 remains bonded to the carrier 404.

Figure 4C:
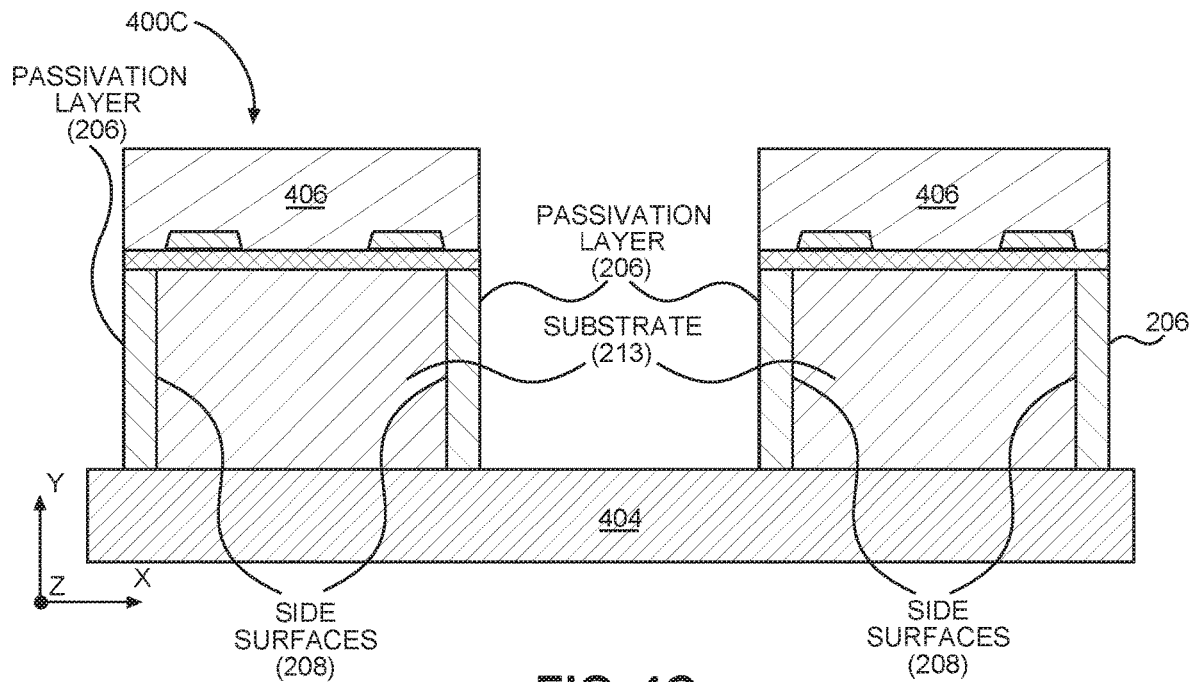

FIG. 4C is a cross-sectional side view of fabrication stage 400C which includes forming the passivation layer 206 on the side surfaces 208 of the substrate 213 of the III-V compound die 202 (block 310). As discussed above, forming the passivation layer 206 can be achieved by treating the side surfaces 208 with an oxidation process to form a thick native oxide, or by depositing a polycrystalline layer, such as SiN or SiO, to the side surfaces 208. The passivation layer 206 does not form on the protective layer 406 or on the carrier 404.

Figure 4D:
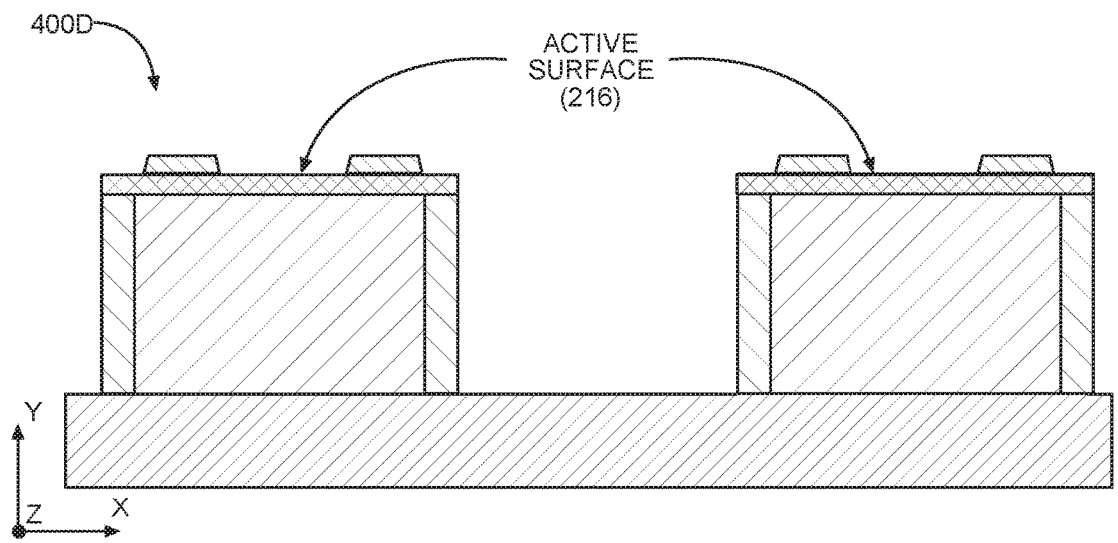

FIG. 4D is a cross-sectional side view of fabrication stage 400D which includes removing the protective layer 406 from the active surface 216 (block 312). Subsequent processes for forming the chip package 200, not illustrated, include removing the at least one III-V compound die 202 from the carrier 404, and coupling one of the at least one III-V compound die 202 to a substrate (not shown). The processes further include electrically coupling the active surface 216 of the one III-V compound die 202 to the substrate with wire bonds. The chip package 200 is further formed by encapsulating the one III-V compound die 202 with the molding compound 210. The passivation layer 206 is between the molding compound 210 and the side surfaces 208 of the one III-V compound die 202.

Figure 5:
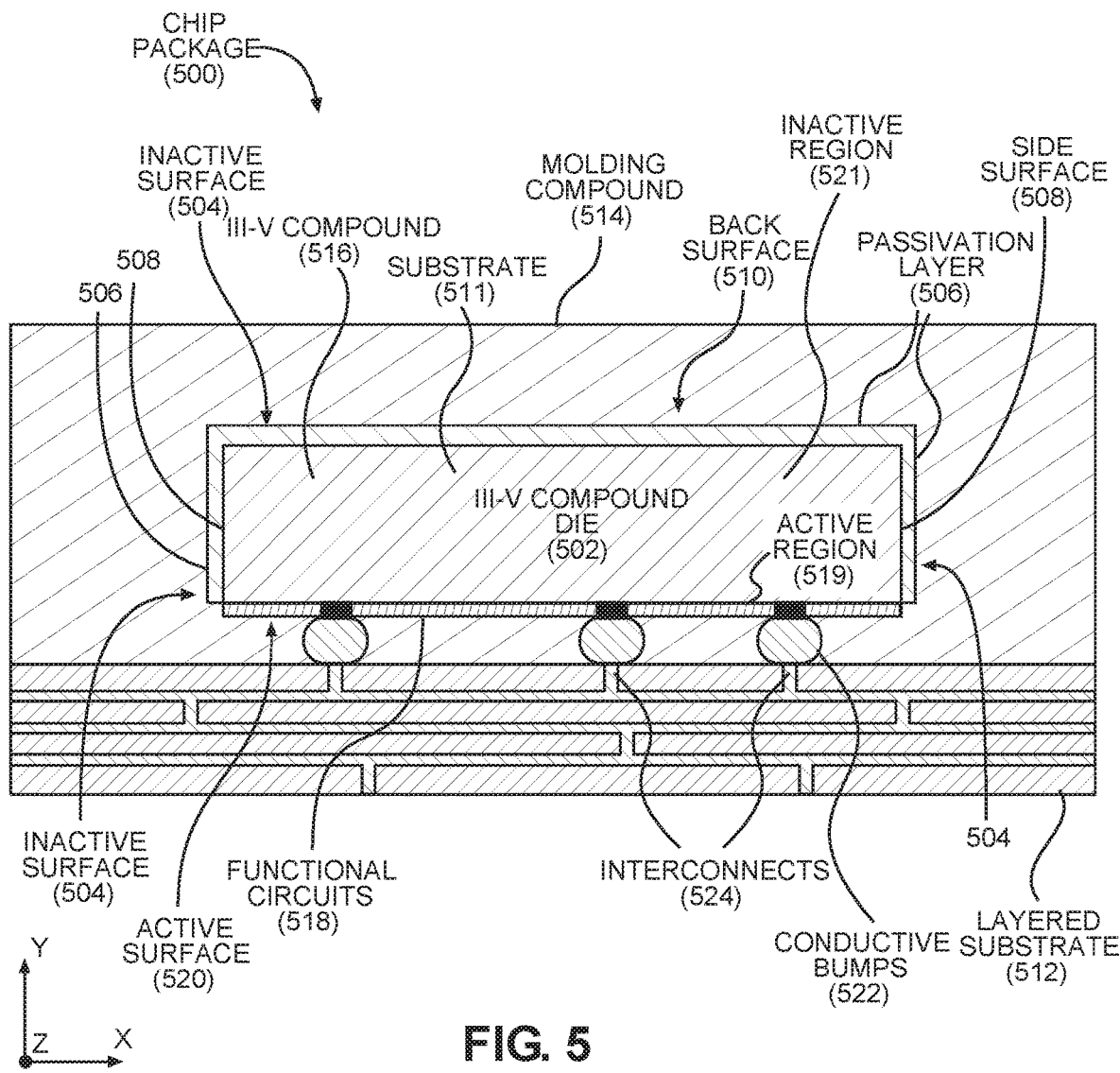
FIG. 5 is a cross-sectional side view of an exemplary flip-chip mounted semiconductor chip package including a passivation layer on inactive surfaces of a III-V compound semiconductor die to avoid fracture by diffusing stress exerted on surface micro-cracks by a molding compound.

FIG. 5 is a cross-sectional side view of a flip-chip semiconductor chip package 500 ("chip package 500") including a III-V compound semiconductor die 502 ("III-V compound die 502") that includes one or more inactive surfaces 504 treated with a passivation layer 506. In FIG. 5, the one or more inactive surfaces 504 are side surfaces 508 and a back surface 510 of a substrate 511. The back surface 510 in FIG. 5 extends in an X-axis direction, and the side surfaces 508 extend in a Y-axis direction orthogonal to the X-axis direction. The III-V compound die 502 is coupled to a layered substrate 512 and is encapsulated by a molding compound 514. As noted, the side surfaces 508 and the back surface 510 are all inactive surfaces, and each is treated with the passivation layer 506 configured to avoid fracture of the III-V compound die 502 by reducing encapsulation stress to the side surfaces 508 and the back surface 510. The passivation layer 506 may be a passivated layer of the substrate 511 or a layer of passivation material deposited on the substrate 511. The III-V compound die 502 is formed of a compound 516, which is any alloy of elements from Group III and Group V of the periodic table of elements. A plurality of functional circuits 518, including logic circuits and/or memory circuits including transistors formed from the III-V compound 516, are formed in an active region 519 including an active surface 520 of the compound die 502. The active region 519 is adjacent to an inactive region 521 of the III-V compound die 502. The inactive region 521 includes the substrate 511. The active surface 520 extends in the X-axis direction on an opposite side of the III-V compound die 502 to the back surface 510. The back surface 510 and the side surfaces 508 are inactive because they do not include functional circuits 518.

In contrast to the chip package 200 in FIG. 2, in the chip package 500 in FIG. 5, the active surface 520 of the compound die 502 faces the layered substrate 512. A plurality of conductive bumps 522, between the active surface 520 and the layered substrate 512, electrically couple the functional circuits 518 to interconnects 524 on the layered substrate 512. The conductive bumps 522 may be, for example, solder bumps or solder balls formed of one or more conductive metals. The interconnects 524 are employed to mechanically and/or electrically couple the functional circuits 518 to an external circuit (not shown).

With the active surface 520 facing the layered substrate 512, the back surface 510 and the side surfaces 508 are exposed to the molding compound 514 encapsulating the III-V compound die 502. Therefore, each of the back surface 510 and the side surfaces 508 is treated with the passivation layer 506 to avoid fracturing of the III-V compound die 502 by reducing encapsulation stresses exerted by the molding compound 514 on the side surfaces 508 and the back surface 510.

The inactive surfaces 504 as described herein are not limited to a back surface 510 extending in the X-axis direction and one or more side surfaces 508 extending in the Y-axis direction, and could include surfaces not extending in either the X-axis direction or the Y-axis direction.

Figure 6:
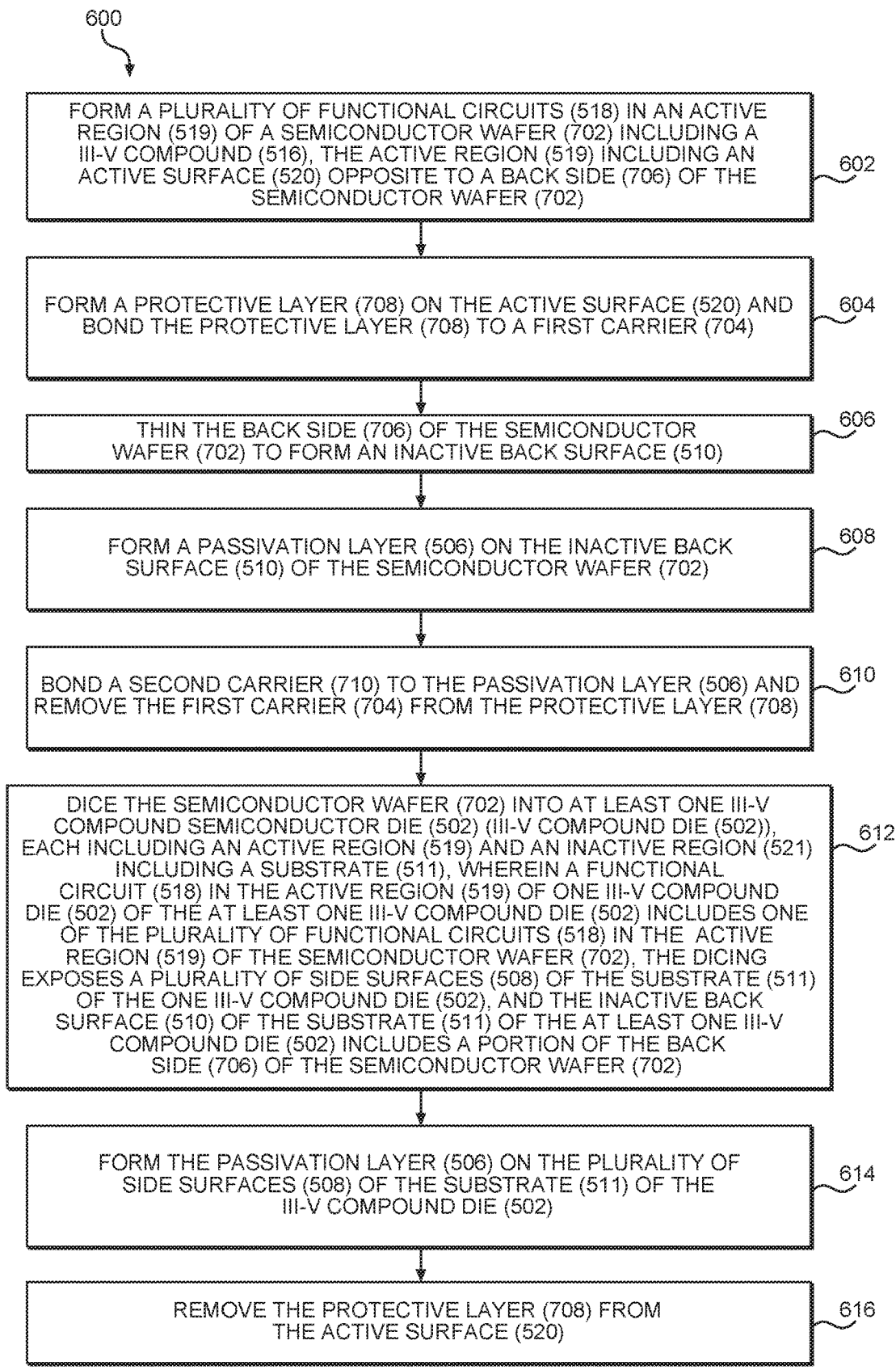
FIG. 6 is a flowchart of an exemplary method of fabricating a compound semiconductor die to be employed in the flip-chip mounted semiconductor chip package in FIG. 5, wherein the method includes treating inactive surfaces of the III-V compound semiconductor die with a passivation layer to diffuse stress exerted by a molding compound.

FIG. 6 is a flowchart illustrating a method 600 of fabricating the III-V compound die 502 employed in the chip package 500 in FIG. 5. The method 600 is described below with reference to fabrication stages 700A-700G illustrated in FIGS. 7A-7G.

Figure 7A:
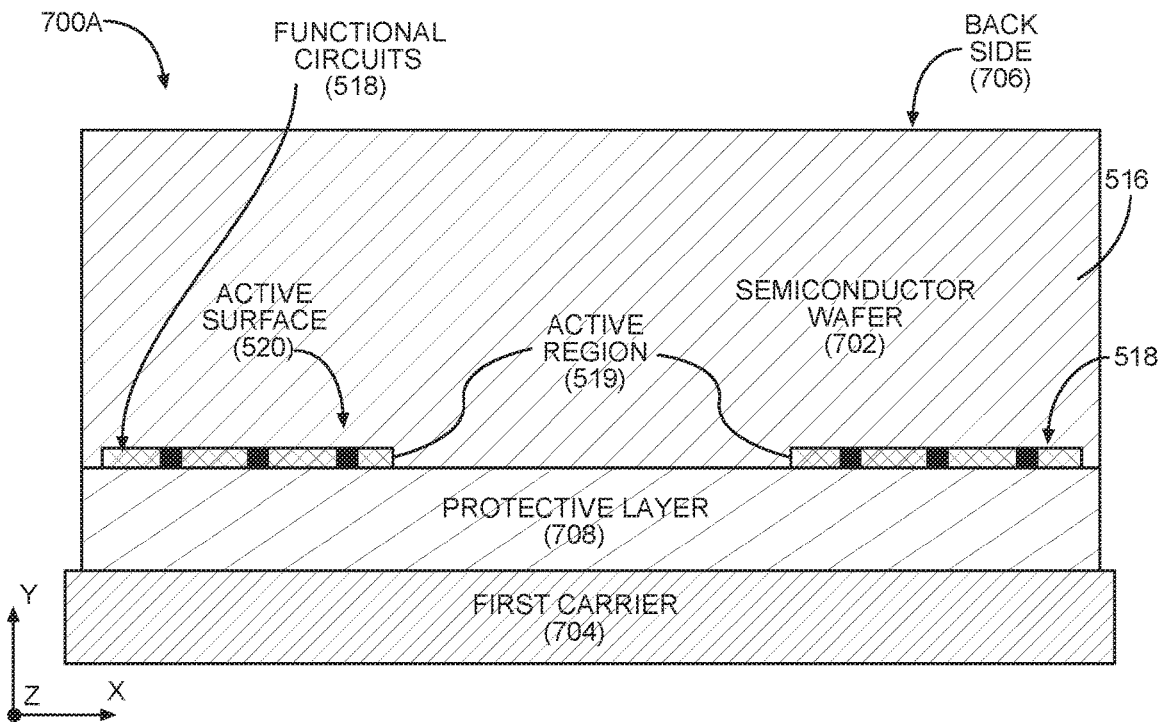
FIGS. 7A-7G are cross-sectional side views of exemplary fabrication stages of the fabrication of the III-V compound semiconductor die employed in the flip-chip mounted semiconductor chip package in FIG. 5 including a passivation layer on inactive surfaces of the III-V compound semiconductor die to avoid fracture by diffusing stress exerted on surface micro-cracks by a molding compound.

FIG. 7A is a cross-sectional side view of fabrication stage 700A in which a semiconductor wafer 702 including the III-V compound 516 is coupled to a first carrier 704. The cross-sectional side views in FIGS. 7A-7G are views in a direction of a Z-axis of a plane including an X-axis and a Y-axis. A purpose of the first carrier 704 is to allow the semiconductor wafer 702 to be physically manipulated during processing without damage. The method 600 includes forming the plurality of functional circuits 518 in the active region 519 of the semiconductor wafer 702. The active region 519 includes the active surface 520, which is opposite to a back side 706 of the semiconductor wafer 702 (block 602). The method 600 further includes forming a protective layer 708 on the active surface 520 and bonding the protective layer 708 to the first carrier 704 (block 604). As used herein, the term "bonding" includes any applicable method of attaching as known in the art.

Figure 7B:
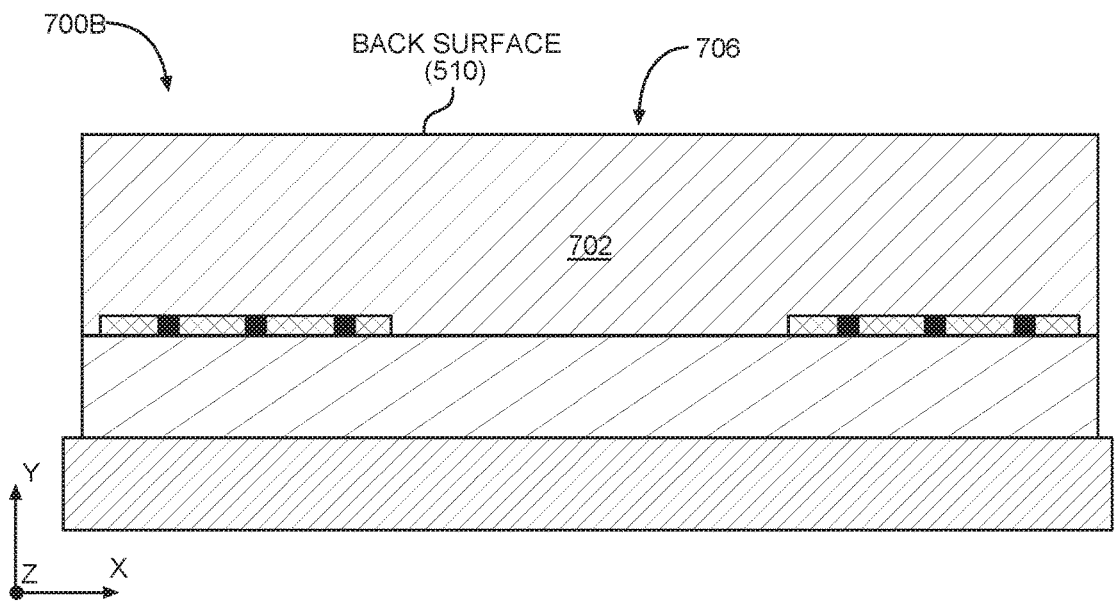

FIG. 7B is a cross-sectional side view of fabrication stage 700B including thinning the back side 706 of the semiconductor wafer 702 to form the inactive back surface 510 (block 606). The semiconductor wafer 702 may be thinned from an initial wafer thickness of about 650 μm to a desired die thickness of about 200 μm of the III-V compound die 502 in the chip package 500.

The III-V compound die 502 in the flip-chip configuration in FIG. 5 is encapsulated by the molding compound 514 on the back surface 510 as well as the side surfaces 508. Therefore, the back surface 510 is treated with the passivation layer 506 at separate steps from treating the side surfaces 508 with the passivation layer 506 in the method 600, as explained herein.

Figure 7C:
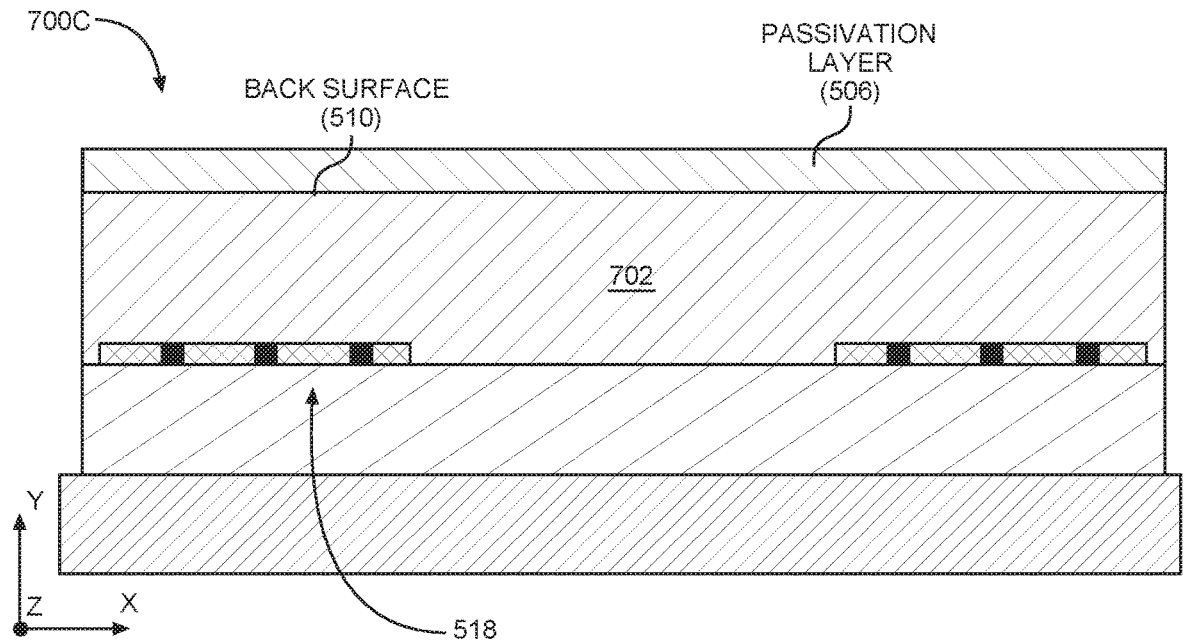

FIG. 7C is a cross-sectional side view of fabrication stage 700C including forming the passivation layer 506 configured to reduce encapsulation stress on the inactive back surface 510 of the semiconductor wafer 702 (block 608). The side surfaces 508 are not created until the semiconductor wafer 702 is diced, but dicing is performed with the active surface 520 exposed so a dicing tool can be visually aligned with dicing streets (not shown) on the active surface 520. The dicing streets have a width of about 60 μm. Thus, the back surface 510 is first treated with the passivation layer 506 in the method 600 and, once the passivation layer 506 is provided, the semiconductor wafer 702 may be handled from the back side 706 for subsequent processing, such as dicing and treatment of the side surfaces 508 with the passivation layer 506.

Figure 7D:
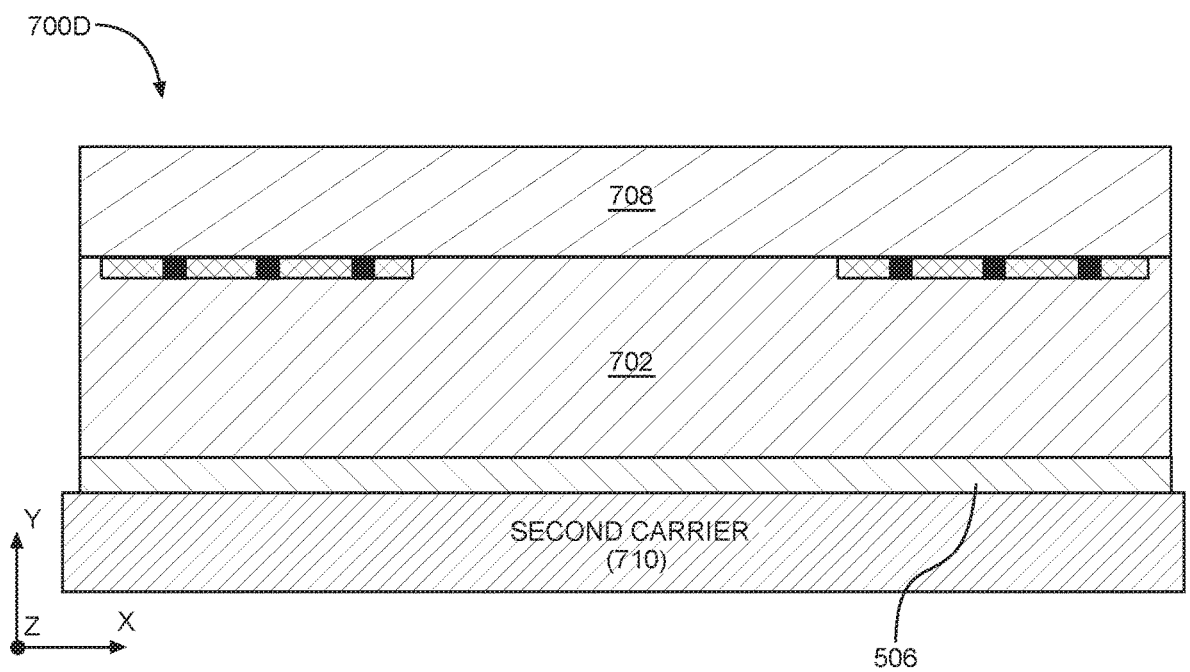

In this regard, FIG. 7D is a cross-sectional side view of fabrication stage 700D including bonding a second carrier 710 to the passivation layer 506, and removing the first carrier 704 from the protective layer 708 (block 610). With the first carrier 704 removed from the protective layer 708, the dicing tool can be aligned to the dicing streets on the active surface 520. Fabrication stage 700D in FIG. 7D is similar to fabrication stage 400A in FIG. 4A. However, to protect the back surface 510 from being exposed to the molding compound 514, the chip package 500 includes the passivation layer 506 between the semiconductor wafer 702 and the second carrier 710.

Figure 7E:
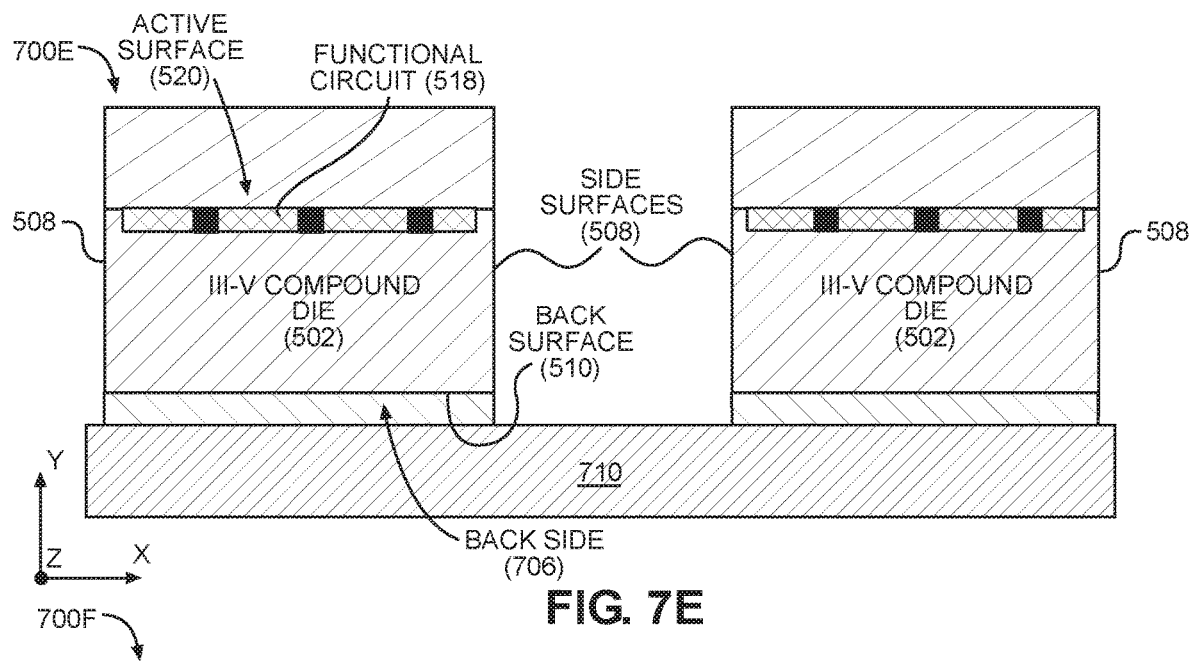

FIG. 7E is a cross-sectional side view of fabrication stage 700E including dicing the semiconductor wafer 702 into at least one III-V compound die 502. Each of the at least one III-V compound die 502 includes the active region 519 and the inactive region 521, which further includes the substrate 511. The dicing exposes the side surfaces 508 of the III-V compound die 502. The III-V compound die 502 from the semiconductor wafer 702 may have a length dimension and a width dimension that are each in the range of about 1 mm. A functional circuit 518 on the active surface 520 of one of the at least one compound die 502 includes one of the plurality of functional circuits 518 that are formed in the active region 519 of the semiconductor wafer 702 in FIGS. 7A-7D. The side surfaces 508 of the substrate 511 are created and exposed where the semiconductor wafer 702 is separated or portions of the semiconductor wafer 702 are removed by the dicing tool from between the at least one III-V compound die 502. A back surface 510 of the substrate 511 of the one III-V compound die 502 is formed from a portion of the back side 706 of the semiconductor wafer 702 (block 612). As shown in FIG. 7E, the second carrier 710 is not cut in the dicing process in fabrication stage 700E, and the at least one compound die 502 remains coupled to the second carrier 710.

Figure 7F:
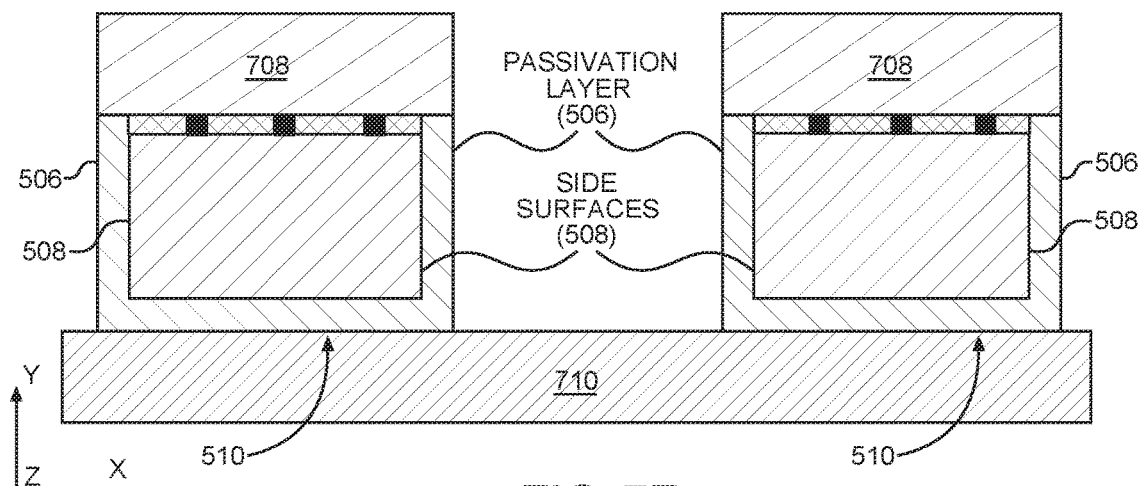

FIG. 7F is a cross-sectional side view of fabrication stage 700F which includes forming the passivation layer 506 on the side surfaces 508 of the substrate 511 of the at least one III-V compound die 502 (block 614). The passivation layer 506 extends continuously from the back surface 510 to the side surfaces 508 leaving none of the inactive surfaces of the at least one III-V compound die 502 exposed. As discussed above, forming the passivation layer 506 can include forming a passivation layer of the substrate 511 by treating the side surfaces 508 and on the back surface 510 with an oxidation process to form a thick native oxide. Alternatively, the passivation layer 506 can include depositing a passivation material on the side surfaces 508 and the back surface 510 by depositing a polycrystalline layer, such as SiN or SiO, for example, to the side surfaces 508. The passivation layer 506 is not formed on the protective layer 708 or on the second carrier 710.

Figure 7G:
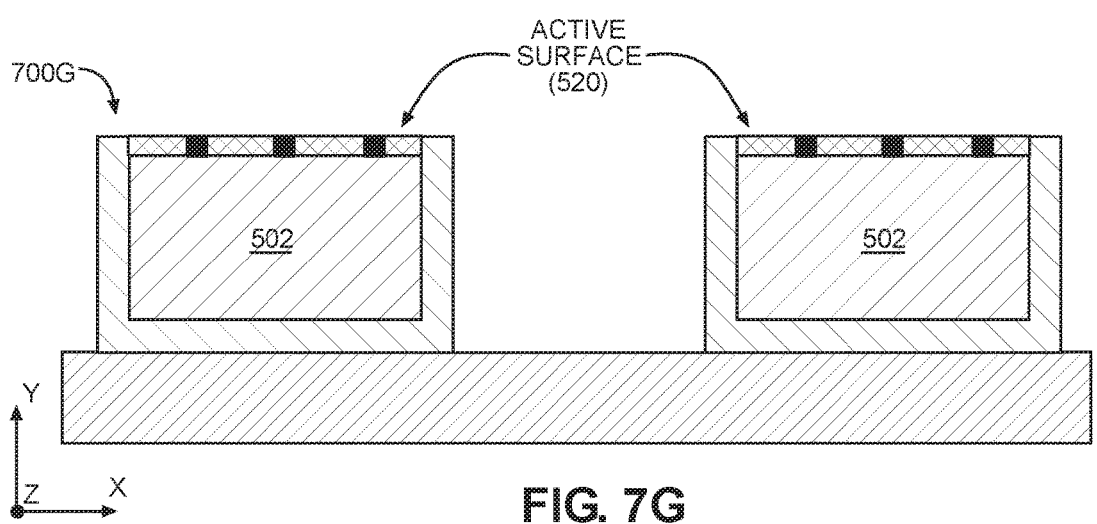

FIG. 7G is a cross-sectional side view of fabrication stage 700G which includes removing the protective layer 708 from the active surface 520 of the at least one compound die 502 (block 616).

Subsequent processes for forming the chip package 500 (not illustrated) include removing the at least one III-V compound die 502 from the second carrier 710 and coupling the at least one compound die 502 to the layered substrate 512, with the active surface 520 of the at least one III-V compound die 502 facing the layered substrate 512. The coupling comprises physically and/or electrically coupling the conductive bumps 522 to the functional circuits 518 and to the interconnects 524 of the layered substrate 512. Forming the chip package 500 further includes encapsulating the at least one III-V compound die 502 with the molding compound 514, with the passivation layer 506 between the molding compound 514 on the side surfaces 508 and the back surface 510 of the at least one III-V compound die 502.

Imperfections, such as micro-cracks, are formed in the side surfaces 508 during the dicing in fabrication stage 700E. Imperfections are similarly created on the back surface 510 during the thinning in fabrication stage 700B. Forming the passivation layer 506 over the back surface 510 and the side surfaces 508, which are all inactive surfaces 504 that may have imperfections or micro-cracks, prevents or avoids fractures in the III-V compound die 502 caused by stresses exerted on the inactive surfaces 504 by the molding compound 514 in the chip package 500.

A semiconductor chip package in which inactive surfaces of a III-V compound die are treated with a passivation layer to prevent or avoid imperfections, such as micro-cracks, in the inactive surfaces from propagating to create a fracture in the III-V compound semiconductor die due to stresses exerted by a molding compound, as illustrated in any of FIGS. 2 and 5, according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multi copter.

Figure 8:
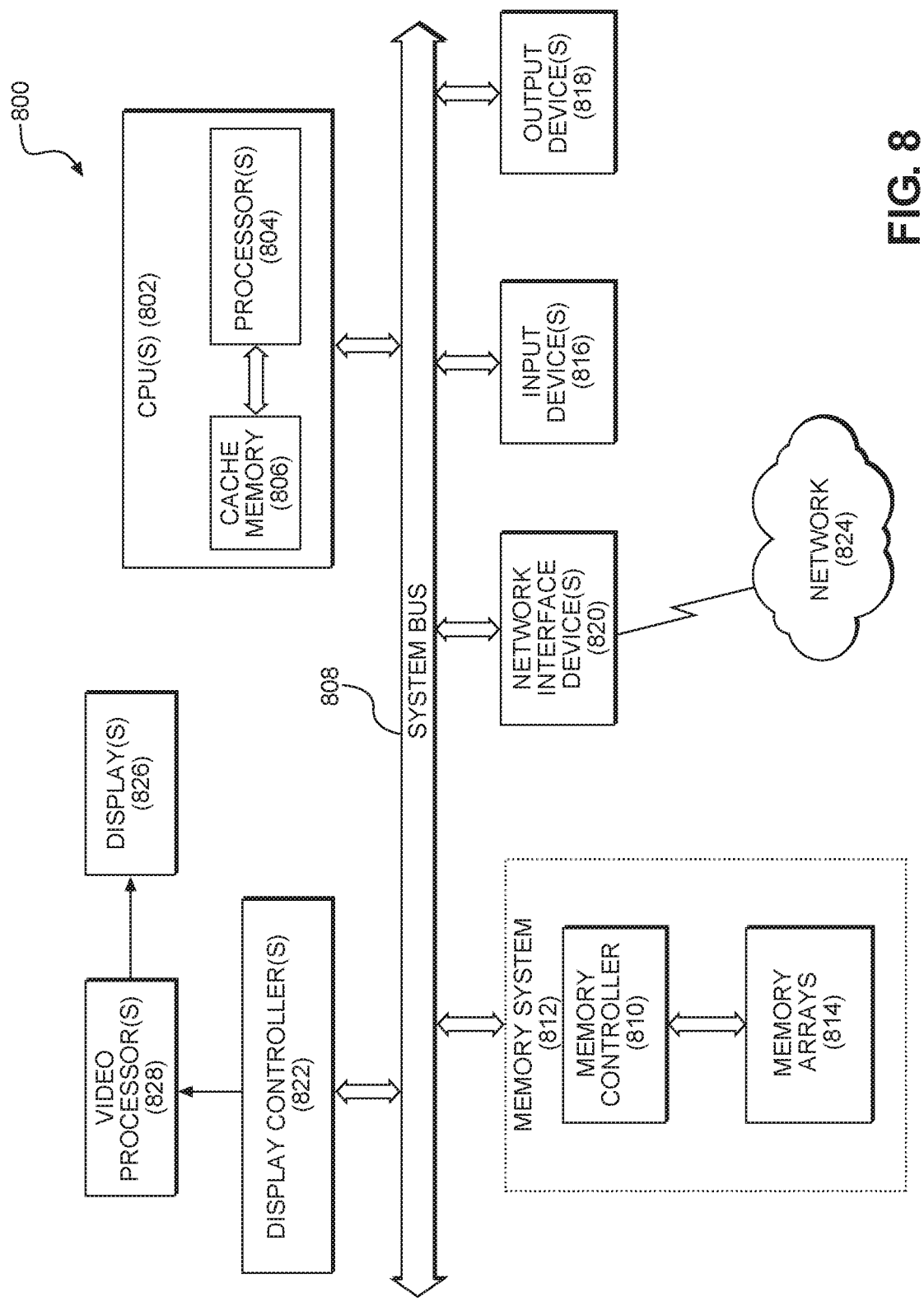
FIG. 8 is a block diagram of an exemplary processor-based system that can include a semiconductor chip package in which inactive surfaces of a compound semiconductor die are treated with a passivation layer to diffuse encapsulation stress to surface micro-cracks caused by a molding compound as in the semiconductor chip packages in either of FIG. 2 or 5.

In this regard, FIG. 8 illustrates an example of a processor-based system 800 including a semiconductor chip package in which inactive surfaces of a III-V compound semiconductor die ("III-V compound die") are treated with a passivation layer to prevent or avoid imperfections, such as micro-cracks, in the inactive surfaces from propagating to create a fracture in the III-V compound die due to stresses exerted by a molding compound, as illustrated in any of FIGS. 2 and 5, and according to any aspects disclosed herein. In this example, the processor-based system 800 includes one or more central processor units (CPUs) 802, which may also be referred to as CPU or processor cores, each including one or more processors 804. The CPU(s) 802 may have cache memory 806 coupled to the processor(s) 804 for rapid access to temporarily stored data. As an example, the processor(s) 804 could include a semiconductor chip package in which inactive surfaces of a III-V compound die are treated with a passivation layer to prevent or avoid imperfections, such as micro-cracks, in the inactive surfaces from propagating to create a fracture in the III-V compound die due to stresses exerted by a molding compound, as illustrated in any of FIGS. 2 and 5, and according to any aspects disclosed herein. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812 that includes the memory controller 810 and one or more memory arrays 814, one or more input devices 816, one or more output devices 818, one or more network interface devices 820, and one or more display controllers 822, as examples. Each of the memory system 812, the one or more input devices 816, the one or more output devices 818, the one or more network interface devices 820, and the one or more display controllers 822 can include a semiconductor chip package in which inactive surfaces of a III-V compound die are treated with a passivation layer to prevent or avoid imperfections, such as micro-cracks, in the inactive surfaces from propagating to create a fracture in the III-V compound die due to stresses exerted by a molding compound, as illustrated in any of FIGS. 2 and 5, and according to any aspects disclosed herein. The input device(s) 816 can include any type of input device, including, but not limited to, input keys, switches, voice processors, etc. The output device(s) 818 can include any type of output device, including, but not limited to, audio, video, other visual indicators, etc. The network interface device(s) 820 can be any device configured to allow exchange of data to and from a network 824. The network 824 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 820 can be configured to support any type of communications protocol desired.

The CPU(s) 802 may also be configured to access the display controller(s) 822 over the system bus 808 to control information sent to one or more displays 826. The display controller(s) 822 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc. The display controller(s) 822, display(s) 826, and/or the video processor(s) 828 can include a semiconductor chip package in which inactive surfaces of a III-V compound die are treated with a passivation layer to prevent or avoid imperfections, such as micro-cracks, in the inactive surfaces from propagating to create a fracture in the III-V compound die due to stresses exerted by a molding compound, as illustrated in any of FIGS. 2 and 5, and according to any aspects disclosed herein.

Figure 9:
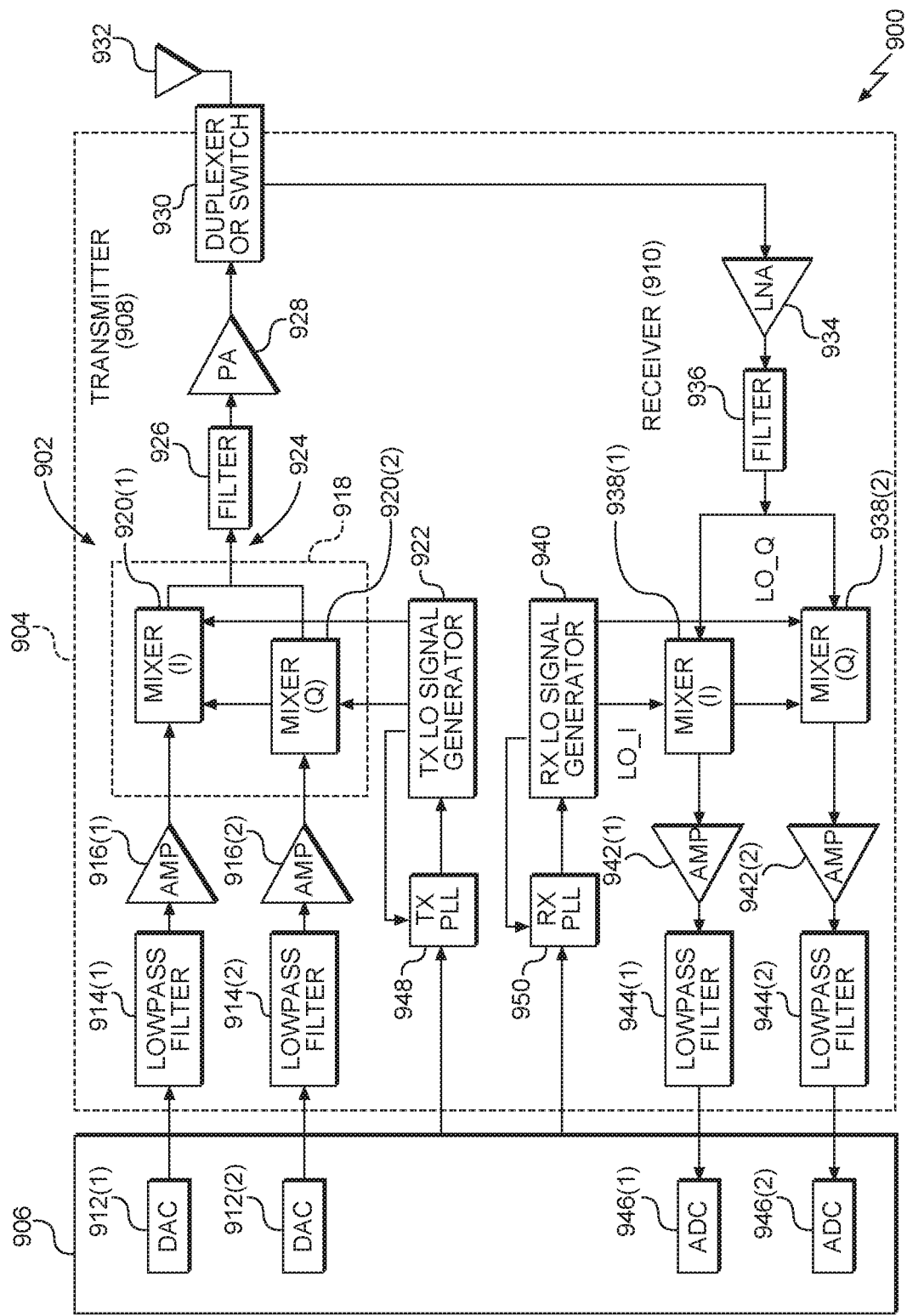
FIG. 9 is a block diagram of an exemplary wireless communications device that includes radio frequency (RP) components formed from a semiconductor chip package in which inactive surfaces of a III-V compound semiconductor die are treated to form a passivation layer to diffuse encapsulation stress to surface micro-cracks caused by a molding compound as in the semiconductor chip packages in either of FIG. 2 or 5.

FIG. 9 illustrates an exemplary wireless communications device 900 that includes radio frequency (RF) components formed from an integrated circuit (IC) 902, wherein any of the components therein can include a semiconductor chip package in which inactive surfaces of a compound die are treated with a passivation layer to prevent or avoid imperfections, such as micro-cracks, in the inactive surfaces from propagating to create a fracture in the III-V compound die due to stresses exerted by a molding compound, as illustrated in any of FIGS. 2 and 5, and according to any aspects disclosed herein. The wireless communications device 900 may include or be provided in any of the above-referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 910. In the direct-conversion architecture, a signal is frequency-converted between RF; and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmitted RF signal. The transmitted RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

What is claimed is:

1. A semiconductor chip package, comprising:
   a III-V compound semiconductor die (III-V compound die) comprising:
      an active region comprising at least one functional circuit and an active surface; and
      an inactive region comprising a substrate comprising a back surface opposite to the active surface, and a plurality of side surfaces;
   a passivation layer disposed on the plurality of side surfaces of the substrate; and
   a molding compound disposed on the passivation layer;
   wherein the passivation layer is not in contact with the active surface of the III-V compound die.

2. The semiconductor chip package of claim 1, wherein the plurality of side surfaces comprises a plurality of side surfaces orthogonal to the active surface.

3. The semiconductor chip package of claim 1, wherein the molding compound is in direct contact with the passivation layer.

4. The semiconductor chip package of claim 1, wherein:
   the III-V compound die is bonded to a layered substrate with the back surface facing the layered substrate; and
   the semiconductor chip package further comprises wire bonds electrically coupling the at least one functional circuit of the active region to interconnects of the layered substrate, the interconnects configured to electrically couple the at least one functional circuit to an external circuit.

5. The semiconductor chip package of claim 1, wherein:
   the III-V compound die is coupled to a layered substrate with the active surface facing the layered substrate; and
   the semiconductor chip package further comprises a plurality of conductive bumps electrically coupled to the at least one functional circuit and to the layered substrate.

6. The semiconductor chip package of claim 1, wherein the passivation layer comprises one of a passivated layer of the substrate and a passivation material on the substrate.

7. The semiconductor chip package of claim 6, wherein the passivated layer of the substrate comprises a native oxide and the passivation material comprises a polycrystalline layer.

8. The semiconductor chip package of claim 7, wherein:
   the passivation layer comprises the polycrystalline layer; and
   the polycrystalline layer further comprises one of a silicon nitride (SiN) layer and a silicon oxide (SiO) layer.

9. The semiconductor chip package of claim 7, wherein:
   the passivated layer comprises the native oxide;
   the III-V compound die comprises gallium arsenide (GaAs); and the native oxide comprises one of arsenic oxide ($As_2O_3$) and gallium oxide ($Ga_2O_3$).

10. The semiconductor chip package of claim 1, further comprising a layered substrate comprising interconnects configured to couple the III-V compound die to an external circuit.

11. The semiconductor chip package of claim 10, wherein the molding compound on the III-V compound die encapsulates all sides of the III-V compound die not facing the layered substrate.

12. The semiconductor chip package of claim 1 comprising an integrated circuit (IC).

13. The semiconductor chip package of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

\* \* \* \* \*